United States Patent
Matsumoto

(10) Patent No.: US 7,595,546 B2
(45) Date of Patent: Sep. 29, 2009

(54) PRINTED CIRCUIT BOARD

(75) Inventor: Shoji Matsumoto, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 190 days.

(21) Appl. No.: 11/548,431

(22) Filed: Oct. 11, 2006

(65) Prior Publication Data
US 2007/0195473 A1 Aug. 23, 2007

(30) Foreign Application Priority Data
Oct. 12, 2005 (JP) ............................. 2005-297408
Oct. 4, 2006 (JP) ............................. 2006-272766

(51) Int. Cl.
*H01L 23/64* (2006.01)
*H05K 7/00* (2006.01)
*H04B 3/28* (2006.01)

(52) U.S. Cl. .................... 257/664; 361/760; 333/12; 333/32; 333/153; 333/160

(58) Field of Classification Search ............... 257/662, 257/664, 665
See application file for complete search history.

(56) References Cited

U.S. PATENT DOCUMENTS

| 4,831,497 | A | * | 5/1989 | Webster et al. | ............... 361/774 |
| 6,570,463 | B1 | * | 5/2003 | Nedachi | ....................... 333/20 |
| 7,372,144 | B2 | * | 5/2008 | Dutta | ......................... 257/700 |
| 7,385,281 | B2 | * | 6/2008 | Nishio et al. | ................. 257/686 |
| 2001/0035769 | A1 | * | 11/2001 | Takekuma et al. | ............ 326/30 |
| 2002/0084514 | A1 | * | 7/2002 | Maetani | ..................... 257/662 |

FOREIGN PATENT DOCUMENTS

JP 2001-111408 4/2001

\* cited by examiner

*Primary Examiner*—Jasmine J Clark
(74) *Attorney, Agent, or Firm*—Fitzpatrick, Cella, Harper & Scinto

(57) ABSTRACT

Impedance mismatching points such as a VIA and a connector on a differential line between a differential driver element and a differential receiver element are arranged in predetermined positions. That is, the impedance mismatching points are arranged in such positions that a transmission time of a digital signal transmitted through a main differential line becomes (integral multiple of UI)±0.5×Trf, whereby noises are generated within the rise and fall times of a signal to be able to maintain an excellent waveform of the signal.

6 Claims, 9 Drawing Sheets

Background Art

PRINTED CIRCUIT BOARD

BACKGROUND OF THE INVENTION

1. Field of the Invention

The present invention relates to a printed circuit board including a differential line for transmitting a high-speed digital signal.

2. Description of the Related Art

Up to now, a differential line is used to transmit a high-speed digital signal. The differential line can reduce a radiation noise caused from the high-speed digital signal. In order to suppress the reflection of signals on a printed circuit board, there are cases where a circuit termination of transmission side and a circuit termination of reception side are provided on a transmission line for connecting an output circuit with an input circuit. The circuit termination of transmission side is located near the output circuit and the circuit termination of reception side is located near the input circuit. However, complete impedance matching is not obtained between a connection point of the circuit termination of transmission side and a connection point of the circuit termination of reception side on the differential line, so that a slight number of reflected waves are generated. In a high-speed circuit, the slight number of reflected waves are superimposed on a signal to generate noises, thereby reducing the quality of a signal waveform. A reduction in quality of the signal waveform causes a bit error of the input circuit.

Japanese Patent Application Laid-Open No. 2001-111408 discloses that a round trip transmission time of a signal transmitted between the connection point of the circuit termination of transmission side and the connection point of the circuit termination of reception side is set so as to become an integral multiple of a switching period of the signal. Therefore, the amount of jitter caused by reflection at a mismatching point is reduced.

In recent years, an increase in frequency of a digital signal has been accelerated, so that the influence of an electrical mismatching point of the differential line on the quality of a signal becomes significantly larger. That is, each of the rise and fall times (Trf) of the signal becomes shorter with the increase in frequency of the digital signal. In other words, a higher-order harmonic signal is used, so that a generated noise becomes larger. Here, the rise and fall times (Trf) of the signal in the present invention is defined to be a time required for changing an amplitude of the signal from 20% to 80% and from 80% to 20%, respectively.

A problem of the mismatching point disclosed by Japanese Patent Application Laid-Open No. 2001-111408 is caused by impedance at the connection point of the circuit termination of transmission side and an impedance at the connection point of the circuit termination of reception side. However, when a frequency becomes equal to or larger than 1 GHz, the signal quality is influenced by changes in impedances not only at the connection point of the circuit termination of transmission side and the connection point of the circuit termination of transmission side but also at points which exist in all positions on the transmission line and which has been ignorable up to now, such as a connection pad for mounting ICs, a via hole (VIA), and a connector. In particular, when there is a point whose impedance is varied by a value equal to or larger than ±10% of an impedance of a main line of the printed circuit board, the signal quality is influenced at the point, thereby increasing the risk of bit error of a circuit.

In general, when waveform quality on high-speed transmitting is to be evaluated, an eye pattern is used. The eye pattern to be displayed is obtained by the superimposition of a digital signal for each unit interval (UI) with the abscissa indicating time and the ordinate indicating voltage. The waveform quality is determined by whether or not the eye pattern meets a voltage axis standard and a time axis standard of a hexagonal or rhombic standard value (i.e., mask pattern) of a transmitting system. That is, when the signal is not overlapped with the mask pattern, it is determined that the signal has an excellent signal waveform. On the other hand, when the signal is overlapped with the mask pattern, it is determined that the signal has a defective signal waveform. Here, one unit interval (UI) means a signal period of a digital signal, that is, a minimum time interval necessary for switching between 0 and 1.

An evaluation method using the eye pattern will be described in detail with reference to FIGS. 11A to 11D. FIG. 11A shows a waveform of a periodic differential transmission signal (1→0→1→0→1→0→). FIG. 11B shows an eye pattern of this differential transmission signal. Reference numeral 10 denotes the eye pattern and 11 denotes the mask pattern for determining the quality of the eye pattern 10. An actual differential transmission signal is not necessarily the signal shown in FIG. 11A in which 0 and 1 are alternated. That is, as shown in FIG. 11C, a signal in which values of 0 or 1 are successive (1→0→1→0→1→0→0→1→0→0) is used in many cases. Even when such a signal is used, the superimposition of the waveform is performed for each UI similarly as in the case using the signal shown FIG. 11B to determine the quality of the signal.

FIG. 11D shows an eye pattern in the case where a digital signal of approximately 2 Gbit/sec is transmitted on a differential line including connection pads and via holes (VIA) which become the mismatching points. As is apparent from FIG. 11D, the signal waveform is overlapped with the mask pattern, so that it is likely to cause a bit error of a circuit.

SUMMARY OF THE INVENTION

The present invention has been made to solve the above-mentioned problem. An object of the present invention is to provide a printed circuit board capable of suppressing a reduction in quality of a signal waveform which is caused by impedance mismatching points such as a via hole and a connector on a differential line.

According to the present invention, there is provided a printed circuit board including: a printed wiring board; a first semiconductor device and a second semiconductor device which are mounted on the printed wiring board; and a differential line for transmitting a signal between the first semiconductor device and the second semiconductor device, the differential line including at least three mismatching points which are provided therein and separated from one another, in which each transmission time between adjacent two of the at least three mismatching points satisfies a relationship expressed by the following expression:

$$Td = kUI \pm 0.5 \times Trf$$

where Td is the transmission time, UI is a signal period, Trf is rise and fall times of a signal, and k is a positive integer.

The above and other objects of the invention will become more apparent from the following drawings taken in conjunction with the accompanying drawings.

Further features of the present invention will become apparent from the following description of exemplary embodiments with reference to the attached drawings.

DESCRIPTION OF THE EMBODIMENTS

The present invention focuses attention on the fact that a margin between a signal waveform and a mask pattern becomes larger during each of the rise and fall times (Trf) of the signal waveform, and the margin becomes smaller during a voltage constant time of the signal waveform. That is, noises generated by impedance mismatching points such as a connection pad, a via hole, and a connector on a differential line are set so as to be generated within the rise and fall times of the signal waveform. A noise generation time is included within the rise and fall times of the signal waveform, whereby an allowable noise amplitude becomes significantly larger to suppress a bit error of an input circuit.

Figure 11A:
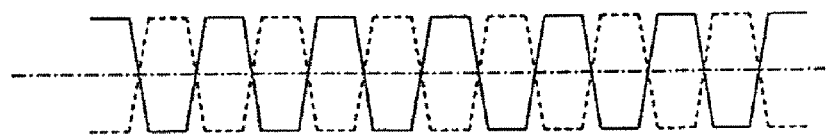
FIGS. 11A, 11B, 11C and 11D are diagrams for explaining a conventional technique.
Figure 11B:
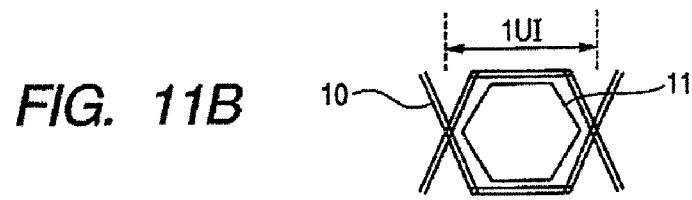
Figure 11C:
Figure 11D:
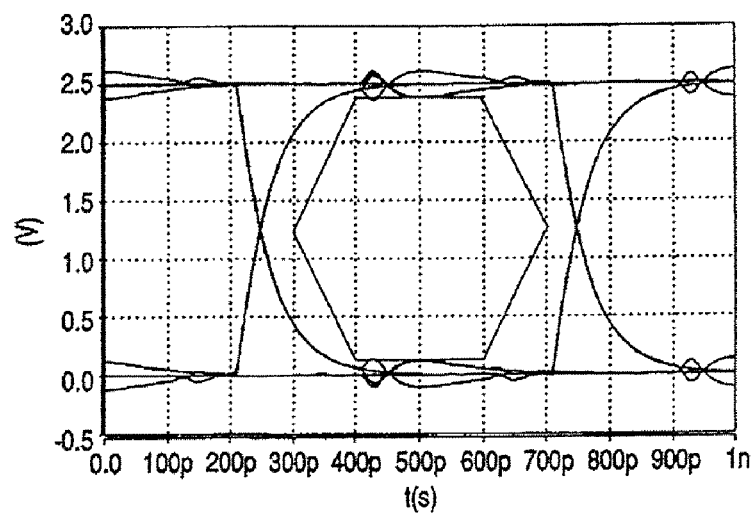

In a case of the structure shown in FIG. 11D, the noises are generated in a flat portion of the eye pattern, that is, at a voltage of 2.5 V or 0.0 V. However, when the noises are generated during the rise and fall times of the signal waveform, the noises are not overlapped with the mask pattern, so that the input circuit does not bit error.

In order to generate noises at an intermediate point of the rise of the signal waveform or an intermediate point of the fall thereof, it is only necessary to set a transmission time between respective mismatching points to an integral multiple of one unit interval (UI). In order to include the noise generation time within the ranges of the rise and fall time of the eye pattern of a transmission signal, it is only necessary to set the transmission time between the mismatching points to (integral multiple of unit interval)±0.5×Trf.

Next, best modes for embodying the present invention will be described with reference to the attached drawings.

Embodiment 1

Figure 1A:
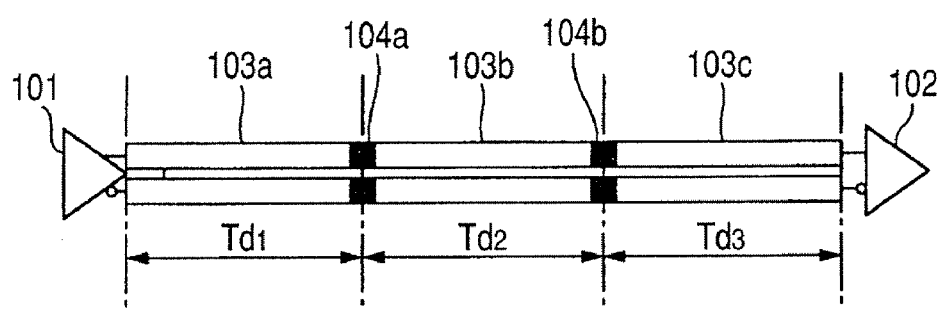
FIGS. 1A and 1B are a plan view and a cross sectional view of a printed circuit board in Embodiment 1 of the present invention.
Figure 1B:
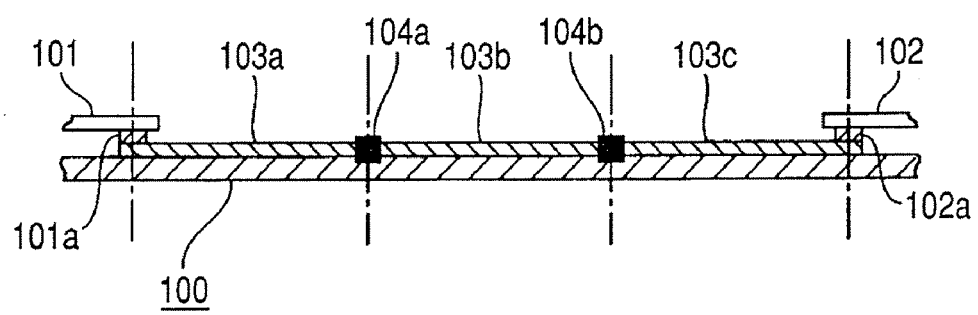

FIGS. 1A and 1B are schematic diagrams showing a printed circuit board according to Embodiment 1 of the present invention. A printed circuit board 100 includes a differential driver element 101 which is a driver element of a first semiconductor device and a differential receiver element 102 which is a receiver element of a second semiconductor device, which are mounted thereon. The differential driver element 101 which is a semiconductor chip is connected with a main differential line 103a located on the printed circuit board 100 through a pad 101a which is a connection point (i.e., mismatching point). The main differential line 103a is connected with a main differential line 103b through an impedance mismatching point 104a such as a via hole (VIA). The main differential line 103b is connected with a main differential line 103c through an impedance mismatching point 104b such as a VIA. The main differential line 103c is connected with the differential receiver element 102 which is a semiconductor chip through a pad 102a which is a connection point (i.e., mismatching point).

A signal period (bit/sec.) which is a minimum time interval for switching between 0 and 1 of a digital signal outputted from the differential driver element 101 is set to 1 UI. In this time, a transmission time Td1 which is a delay time from the pad 101a to the impedance mismatching point 104a becomes (integral multiple of UI)±0.5×Trf. A transmission time Td2 between the two impedance mismatching points 104a and 104b also becomes (integral multiple of UI)±0.5×Trf. A transmission time Td3 from the impedance mismatching point 104b to the pad 102a also becomes (integral multiple of UI)±0.5×Trf.

In other words, respective line lengths of the main differential lines 103a, 103b and 103c which constitute the differential line, that is, the positions of the respective impedance mismatching points 104a and 104b are set so as to satisfy relationships expressed by the following expressions.

$$Td1 = k1\text{UI} \pm 0.5 \times Trf$$

$$Td2 = k2\text{UI} \pm 0.5 \times Trf$$

$$Td3 = k3\text{UI} \pm 0.5 \times Trf$$

and $Tdall = (k1+k2+k3)\text{UI} \pm 0.5 \times Trf$

Here, each of k1, k2 and k3 is a positive integer. The rise and fall times (Trf) is necessary times for changing an amplitude of the signal from 20% to 80% and from 80% to 20%, respectively. A waveform of the signal is observed based on a differential voltage of the pad 102a. Impedance values of the main differential lines 103a, 103b and 103c become substantially equal to one another.

Figure 9A:
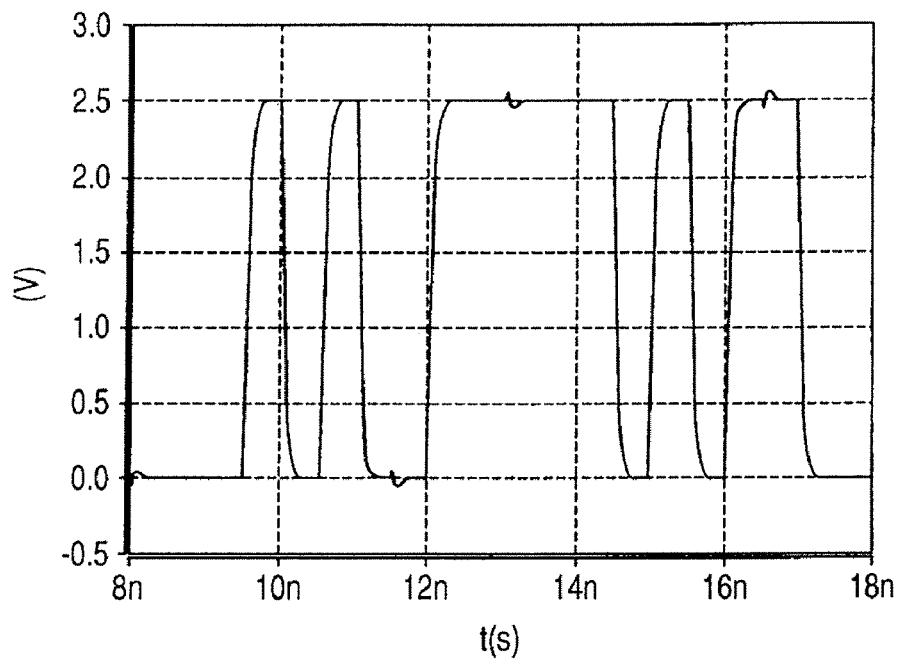
FIGS. 9A and 9B are explanatory graphs showing a signal waveform and an eye pattern in Embodiment 1 of the present invention.
Figure 9B:
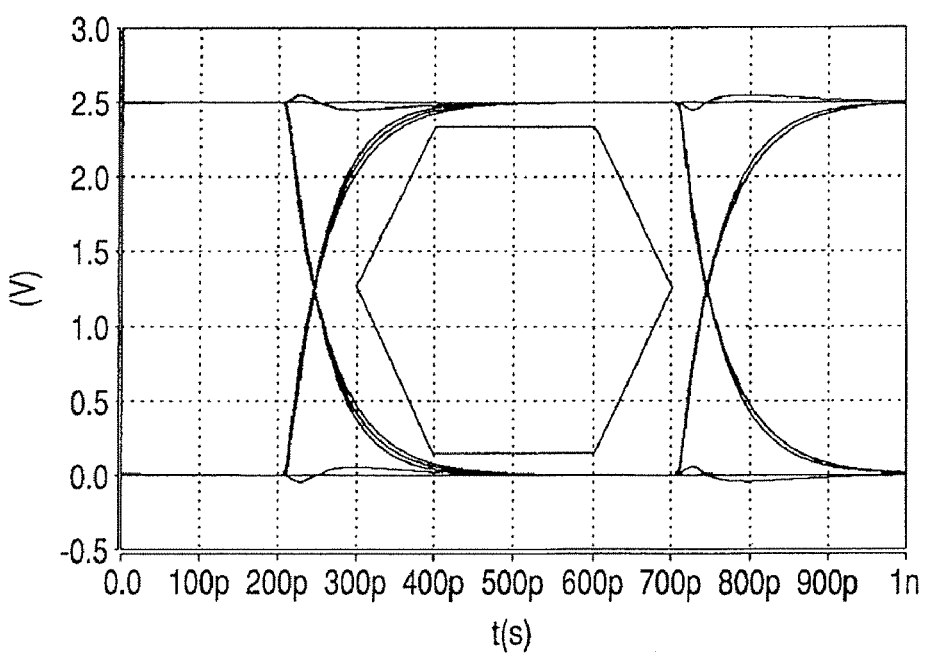

In the above-mentioned constitution, a signal waveform and an eye pattern at the input terminal 102a of the receiver element were measured in a case where a signal of 2 Gbit/sec. was transmitted to a differential line of 150 mm. FIGS. 9A and 9B show a result obtained by the measurement. FIG. 9A shows a signal waveform with the elapse of time. The abscissa indicates a time and the ordinate indicates a voltage. FIG. 9B shows an eye pattern corresponding to the signal waveform shown in FIG. 9A. As is apparent from FIG. 9B, reflection noises generated by the mismatching points on the transmission line are concentrated within the rise and fall times of the signal. Therefore, when the signal waveform is checked against a mask pattern for specifying signal quality, it is found that an excellent signal waveform is maintained without overlapping.

In the above-mentioned constitution, an interval between adjacent mismatching points is set to be equal to or longer than 1 UI. This is because, even when a reflection wave from a mismatching point is large, a noise component caused thereby is converged before a signal reaches a next mismatching point in the case where the interval is equal to or longer than 1 UI. Conversely, when reflection occurs again in a state in which the noise component is not sufficiently converged to thereby occur multiple reflection, the noise becomes synergistically larger. In this embodiment, the multiple reflection can be suppressed.

Embodiment 2

Figure 2A:
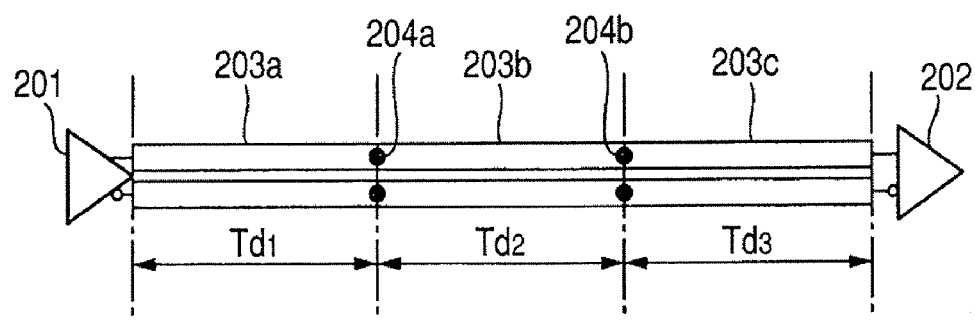
FIGS. 2A and 2B are a plan view and a cross sectional view of a printed circuit board in Embodiment 2 of the present invention.
Figure 2B:
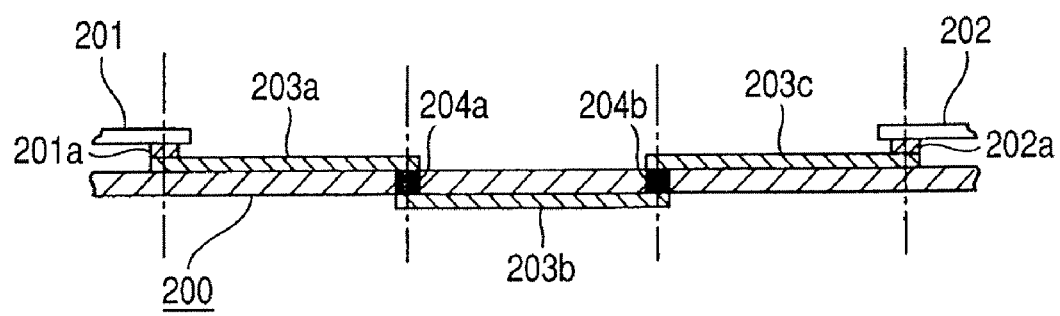

FIGS. 2A and 2B are schematic diagrams showing a printed circuit board according to Embodiment 2 of the present invention. A differential driver element 201 of the first semiconductor device is connected with a main differential line 203a located on a printed wiring board 200 through a pad 201a which is a mismatching point. The main differential line 203a is connected with a main differential line 203b through a VIA 204a which is a mismatching point. The main differential line 203b is connected with a main differential line 203c through a VIA 204b which is a mismatching point. The main differential line 203c is connected with a differential receiver element 202 of the second semiconductor device through a pad 202a which is a mismatching point.

Similarly as in Embodiment 1, the transmission time Td1 from the pad 201a to the VIA 204a is set to (integral multiple of UI)±0.5×Trf. The transmission time Td2 from the VIA 204a to the VIA 204b is also set to (integral multiple of UI)±0.5×Trf. The transmission time Td3 from the VIA 204b to the pad 202a is also set to (integral multiple of UI)±0.5× Trf.

Also in the case of the printed circuit board shown in FIGS. 2A and 2B, an excellent signal waveform can be maintained as in Embodiment 1.

Embodiment 3

Figure 3:
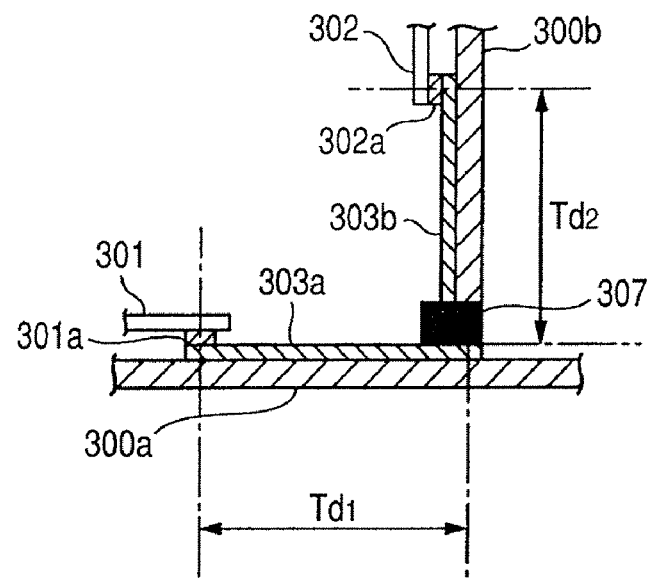
FIG. 3 is a cross sectional view of a printed circuit board in Embodiment 3 of the present invention.

FIG. 3 is a schematic view showing a printed circuit board according to Embodiment 3 of the present invention. A differential driver element 301 of the first semiconductor device is connected with a main differential line 303a located on a first printed wiring board 300a through a pad 301a which is a mismatching point. The main differential line 303a is connected with a main differential line 303b located on a second printed wiring board 300b through a connector 307 which is a mismatching point. The main differential line 303b is connected with a differential receiver element 302 of the second semiconductor device through a pad 302a which is a mismatching point.

Similarly as in Embodiment 1, the transmission time Td1 from the pad 301a to the connector 307 is set to (integral multiple of UI)±0.5×Trf. The transmission time Td2 from the connector 307 to the pad 302a is also set to (integral multiple of UI)±0.5×Trf. While a single connector is used, a signal may be transmitted to the receiver element through two or more connectors.

Also in the case of the printed circuit board shown in FIG. 3, an excellent signal waveform can be maintained as in Embodiment 1.

Embodiment 4

Figure 4:
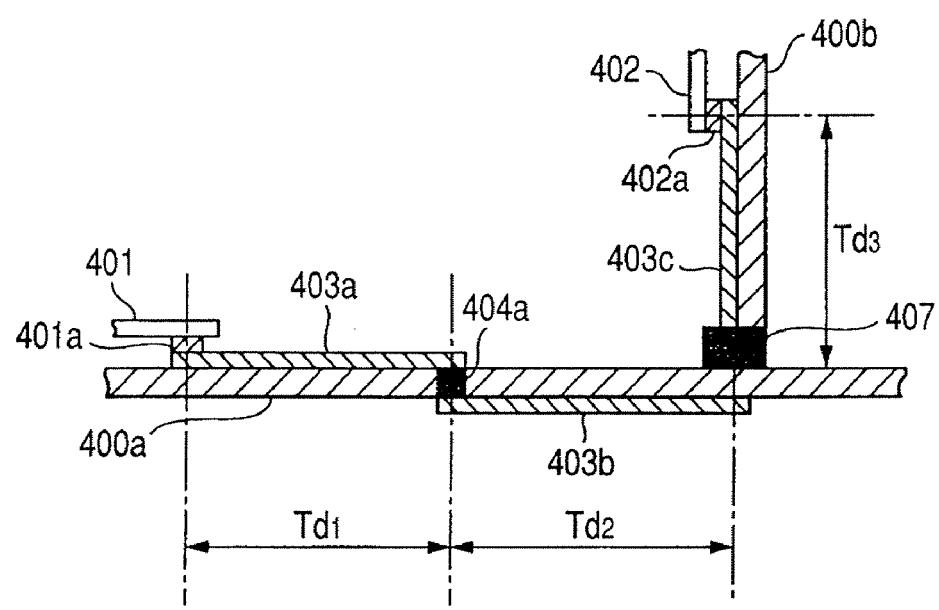
FIG. 4 is a cross sectional view of a printed circuit board in Embodiment 4 of the present invention.

FIG. 4 is a schematic view showing a printed circuit board according to Embodiment 4 of the present invention. A differential driver element 401 of the first semiconductor device is connected with a main differential line 403a located on a first printed wiring board 400a through a pad 401a which is a mismatching point. The main differential line 403a is connected with a main differential line 403b through a VIA 404a which is a mismatching point. The main differential line 403b is connected with a main differential line 403c located on a second printed wiring board 400b through a connector 407 which is a mismatching point. The main differential line 403c is connected with a differential receiver element 402 of the second semiconductor device through a pad 402a which is a mismatching point.

Similarly as in Embodiment 1, the transmission time Td1 from the pad 401a to the VIA 404a is set to (integral multiple of UI)±0.5×Trf. The transmission time Td2 from the VIA 404a to the connector 407 is also set to (integral multiple of UI)±0.5×Trf. The transmission time Td3 from the connector 407 to the pad 402a is also set to (integral multiple of UI)±0.5×Trf. In this case, two or more VIAs may be used, and a time of a signal passing through a VIA is within 0.5×Trf. Although a single connector is used in the above case, a signal may be transmitted to the receiver element through two or more connectors. A transmission time for a single connector is within 0.5×Trf. Each of a transmission time between connectors on a main differential line, a transmission time between VIAs thereon, and a transmission time between a VIA and a connector thereon is (integral multiple of UI)±0.5× Trf. Impedance values of the main differential lines 403a, 403b and 403c having line lengths corresponding to the above-mentioned transmission times become substantially equal to one another.

Also in the case of the printed circuit board shown in FIG. 4, an excellent signal waveform can be maintained as in Embodiment 1.

Embodiment 5

Figure 5A:
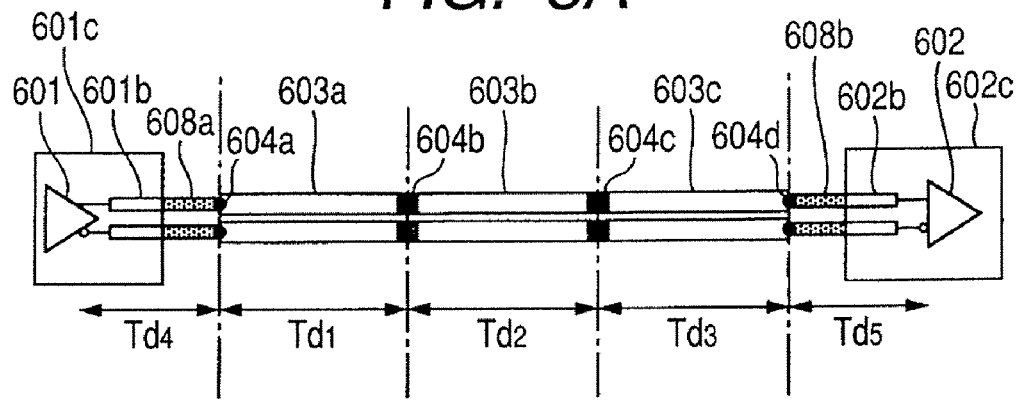
FIGS. 5A and 5B are a plan view and a cross sectional view of a printed circuit board in Embodiment 5 of the present invention.
Figure 5B:
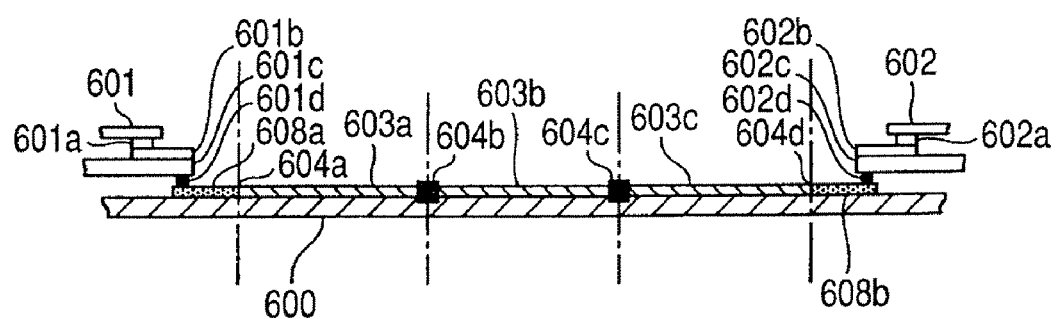

FIGS. 5A and 5B are schematic diagrams showing a printed circuit board according to Embodiment 5 of the present invention. A differential driver element 601 of the first semiconductor device is connected with a differential line (package internal differential line) 601b of a semiconductor package board 601c through a pad 601a which is a mismatching point. The differential line 601b is connected with a sub differential line 608a located on a printed wiring board 600 through a solder ball 601d. The sub differential line 608a is connected with a main differential line 603a through an impedance mismatching point 604a which is a mismatching point. The main differential line 603a is connected with a main differential line 603b through an impedance mismatching point 604b which is a mismatching point. The main differential line 603b is connected with a main differential line 603c through an impedance mismatching point 604c which is a mismatching point. The main differential line 603c is connected with a sub differential line 608b through an impedance mismatching point 604d which is a mismatching point. The sub differential line 608b is connected with a differential line (package internal differential line) 602b located on a semiconductor package board 602c through a solder ball 602d. The differential line 602b is connected with a differential receiver element 602 of the second semiconductor device through a pad 602a which is a mismatching point.

Here, a transmission time Td4 from the pad 601a to the impedance mismatching point 604a on a path including the package internal line and the sub line is set to 1 UI±0.5×Trf. The transmission time Td1 from the impedance mismatching point 604a to the impedance mismatching point 604b is set to (integral multiple of UI)±0.5×Trf. The transmission time Td4 may be set to (integral multiple of UI)±0.5×Trf. The transmission time Td2 from the impedance mismatching point 604b to the impedance mismatching point 604c is set to (integral multiple of UI)±0.5×Trf. The transmission time Td3 from the impedance mismatching point 604c to the impedance mismatching point 604d is set to (integral multiple of UI)±0.5×Trf. A transmission time Td5 from the impedance mismatching point 604d to the pad 602a on a path including the package internal line and the sub line is set to 1 UI±0.5× Trf. The transmission time Td5 may be set to (integral multiple of UI)±0.5×Trf.

In other words, the respective impedance mismatching points 604b and 604c are arranged such that the respective transmission times Td1, Td2 and Td3 satisfy the following relationships. In addition, respective line lengths of the differential lines (package internal lines) 601b and 602b and respective line lengths of the sub differential lines 608a and 608b are set such that the transmission times Td4 and Td5 satisfy the following relationships.

$$Td1 = k1 UI \pm 0.5 \times Trf$$

$$Td2 = k2 UI \pm 0.5 \times Trf$$

$$Td3 = k3 UI \pm 0.5 \times Trf$$

$$Td4 = k4 UI \pm 0.5 \times Trf$$

$$Td5 = k5 UI \pm 0.5 \times Trf$$

and $Tdall = (k1+k2+k3+k4+k5) UI \pm 0.5 \times Trf$

Here, each of k1, k2, k3, k4 and k5 is a positive integer.

Impedance values of the main differential lines 603a, 603b and 603c become substantially equal to one another. The impedances of the sub differential line 608a and the package internal differential line 601b are substantially the same and have a variation of less than ±10%. An impedance of the sub differential line 608b is also substantially equal to an impedance of the package internal differential line 602b and a variation is less than ±10%.

Figure 10:
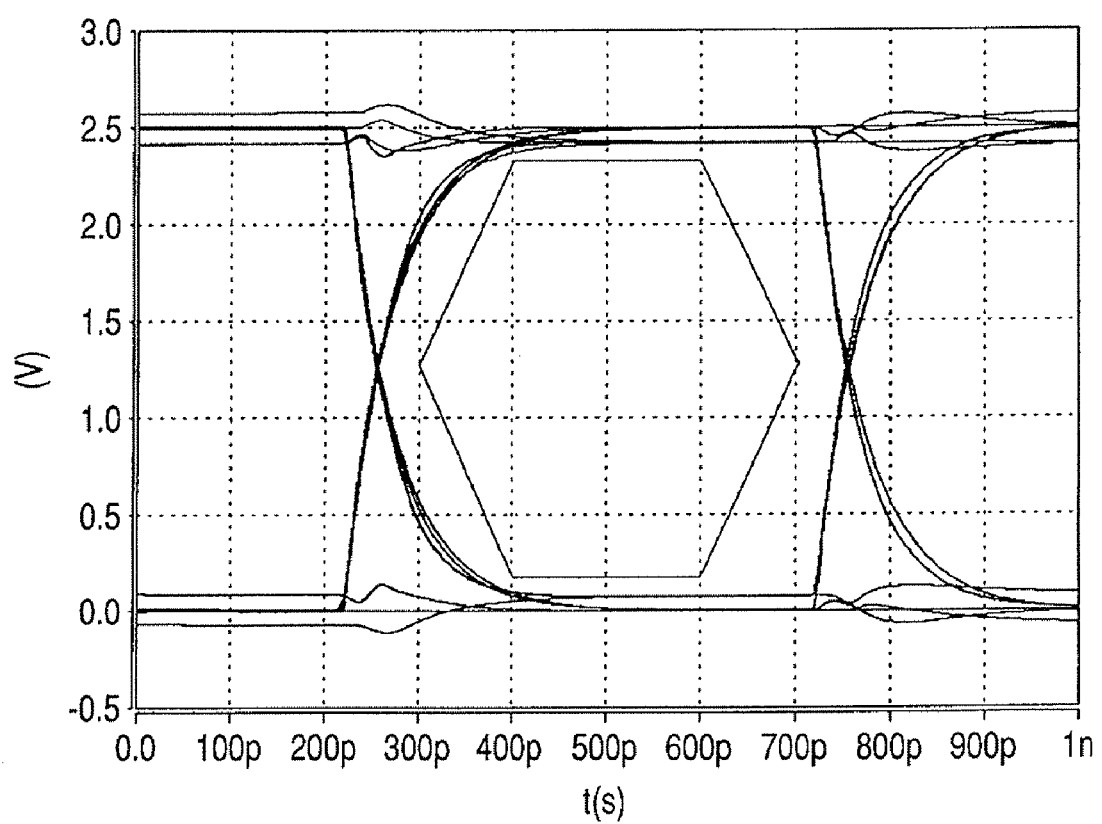
FIG. 10 is an explanatory graph showing an eye pattern in Embodiment 6 of the present invention.

In the above-mentioned constitution, a signal waveform and an eye pattern at the input terminal 602a of the receiver element are measured in the case where a signal of 2 Gbit/sec. is transmitted to a differential line of 150 mm. FIG. 10 shows the measured signal waveform as the eye pattern. As is apparent from FIG. 10, reflection noises generated by the mismatching points on the transmission line are concentrated within the rise and fall times of the signal. Therefore, when the signal waveform is checked against a mask pattern for specifying signal quality, it is found that an excellent signal waveform is maintained without overlapping.

In the above-mentioned constitution, an interval between adjacent mismatching points is set to be equal to or longer than 1 UI. This is because, even when a reflection wave from a mismatching point is large, a noise component caused thereby is converged before a signal reaches a next mismatching point because of the interval equal to or longer than 1 UI. In other words, when reflection occurs again in a state in which the noise component is not sufficiently converged to generate multiple reflection, the noise becomes synergistically larger. Therefore, the multiple reflection can be suppressed in this embodiment.

Embodiment 6

Figure 6A:
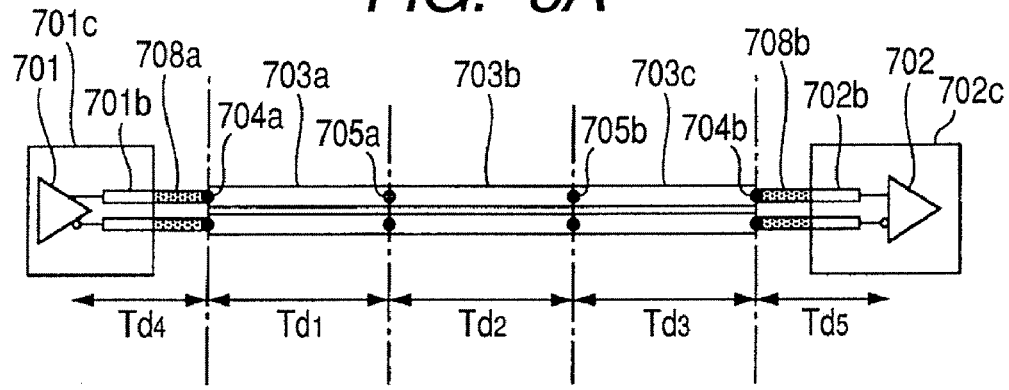
FIGS. 6A and 6B are a plan view and a cross sectional view of a printed circuit board in Embodiment 6 of the present invention.
Figure 6B:
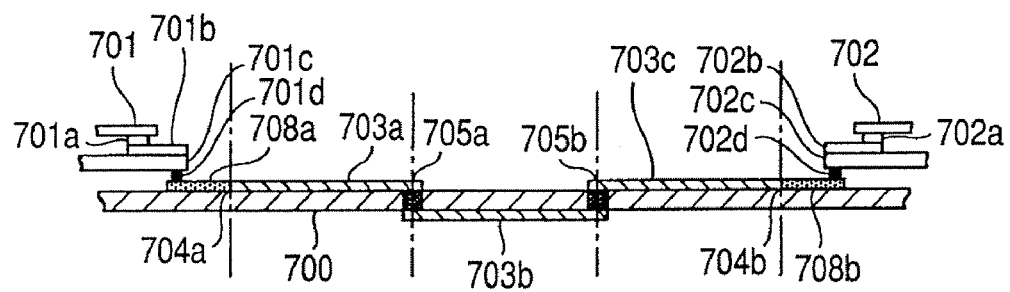

FIGS. 6A and 6B are schematic diagrams showing a printed circuit board according to Embodiment 6 of the present invention. A differential driver element 701 of the first semiconductor device is connected with a differential line (package internal differential line) 701b located on a semiconductor package board 701c through a pad 701a which is a mismatching point. The differential line 701b is connected with a sub differential line 708a located on a printed wiring board 700 through a solder ball 701d. The sub differential line 708a is connected with a main differential line 703a through an impedance mismatching point 704a which is a mismatching point. The main differential line 703a is connected with a main differential line 703b through a VIA 705a which is a mismatching point. The main differential line 703b is connected with a main differential line 703c through a VIA 705b which is a mismatching point. The main differential line 703c is connected with a sub differential line 708b through an impedance mismatching point 704b which is a mismatching point. The sub differential line 708b is connected with a differential line (package internal differential line) 702b located on a semiconductor package board 702c through a solder ball 702d. The differential line 702b is connected with a differential receiver element 702 of the second semiconductor device through a pad 702a which is a mismatching point.

Here, similarly as in Embodiment 5, the transmission time Td4 from the pad 701a to the impedance mismatching point 704a on a path including the package internal differential line and the sub differential line is set to 1 UI±0.5×Trf. The transmission time Td4 may be set to (integral multiple of UI)±0.5×Trf. The transmission time Td1 from the impedance mismatching point 704a to the VIA 705a is set to (integral multiple of UI)±0.5×Trf. The transmission time Td2 from the VIA 705a to the VIA 705b is set to (integral multiple of UI)±0.5×Trf. The transmission time Td3 from the VIA 705b to the impedance mismatching point 704b is set to (integral multiple of UI)±0.5×Trf. The transmission time Td5 from the impedance mismatching point 704b to the pad 702a on a path including the sub differential line and the package internal differential line is set to 1 UI±0.5×Trf. The signal waveform is observed based on a differential voltage of the pad 702a. The transmission time Td5 may be set to (integral multiple of UI)±0.5×Trf.

Also in the case of the printed circuit board shown in FIGS. 6A and 6B, an excellent signal waveform can be maintained similarly as in Embodiment 5.

Embodiment 7

Figure 7:
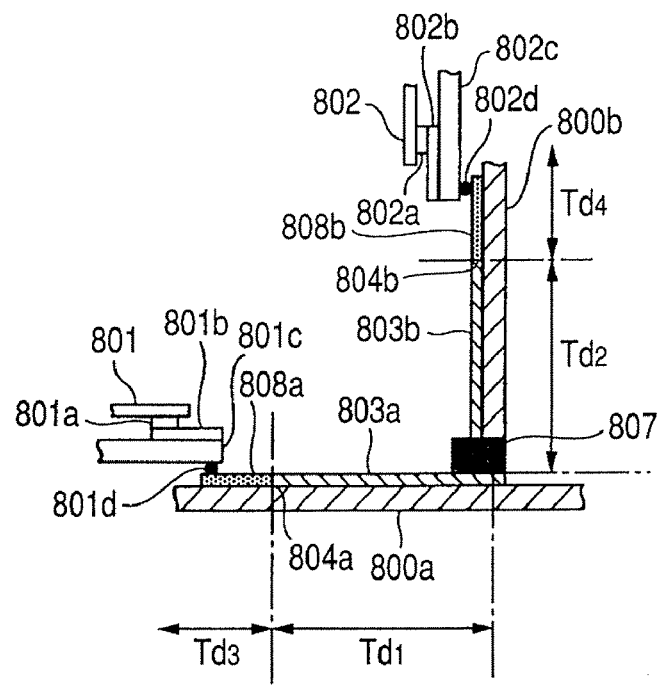
FIG. 7 is a cross sectional view of a printed circuit board in Embodiment 7 of the present invention.

FIG. 7 is a schematic diagram showing a printed circuit board according to Embodiment 7 of the present invention. A differential driver element 801 of the first semiconductor device is connected with a differential line (package internal line) 801b located on a semiconductor package board 801c through a pad 801a which is a mismatching point. The differential line 801b is connected with a sub differential line 808a located on a first printed wiring board 800a through a solder ball 801d. The sub differential line 808a is connected with a main differential line 803a through an impedance mismatching point 804a which is as a mismatching point. The main differential line 803a is connected with a main differential line 803b located on a second printed wiring board 800b through a connector 807 which is a mismatching point. The main differential line 803b is connected with a sub differential line 808b through an impedance mismatching point 804b which is a mismatching point. The sub differential line 808b is connected with a differential line (package internal differential line) 802b located on a semiconductor package board 802c through a solder ball 802d. The differential line 802b is connected with a differential receiver element 802 of the second semiconductor device through a pad 802a which is a mismatching point.

Here, similarly as in Embodiment 5, the transmission time Td3 from the pad 801a to the impedance mismatching point 804a on a path including the package internal differential line and the sub differential line is set to 1 UI±0.5×Trf. The transmission time Td3 may be set to (integral multiple of UI)±0.5×Trf. The transmission time Td1 from the impedance mismatching point 804a to the connector 807 is set to (integral multiple of UI)±0.5×Trf. The transmission time Td2 from the connector 807 to the impedance mismatching point 804b is set to (integral multiple of UI)±0.5×Trf. The transmission time Td4 from the impedance mismatching point 804b to the pad 802a on a path including the sub differential line and the package internal differential line is set to 1 UI±0.5×Trf. The transmission time Td4 may be set to (integral multiple of UI)±0.5×Trf.

Also in the case of the printed circuit board shown in FIG. 7, an excellent signal waveform can be maintained similarly as in Embodiment 5.

Embodiment 8

Figure 8:
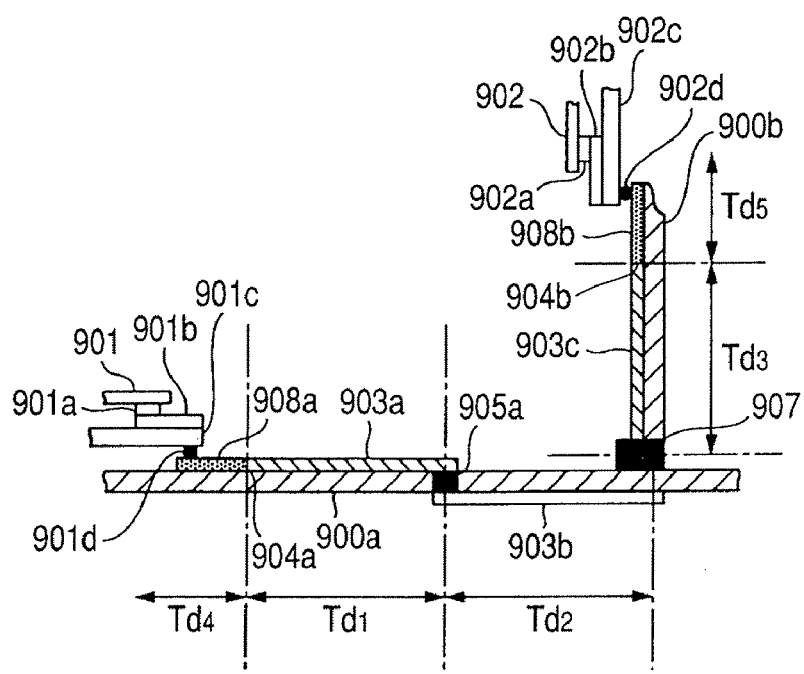
FIG. 8 is a cross sectional view of a printed circuit board in Embodiment 8 of the present invention.

FIG. 8 is a schematic diagram showing a printed circuit board according to Embodiment 8 of the present invention. A differential driver element 901 of the first semiconductor device is connected with a differential line (package internal differential line) 901b located on a semiconductor package board 901c through a pad 901a which is a mismatching point. The differential line 901b is connected with a sub differential line 908a located on a first printed wiring board 900a through a solder ball 901d. The sub differential line 908a is connected with a main differential line 903a through an impedance mismatching point 904a which is a mismatching point. The main differential line 903a is connected with a main differential line 903b through a VIA 905a which is a mismatching point. The main differential line 903b is connected with a main differential line 903c located on a second printed wiring board 900b through a connector 907 which is a mismatching point. The main differential line 903c is connected with a sub differential line 908b through an impedance mismatching point 904b which is a mismatching point. The sub differential line 908b is connected with a differential line (package internal differential line) 902b located on a semiconductor package board 902c through a solder ball 902d. The differential line 902b is connected with a differential receiver element 902 of the second semiconductor device through a pad 902a which is a mismatching point.

Here, similarly as in Embodiment 5, the transmission time Td4 from the pad 901a to the impedance mismatching point 904a on a path including the package internal differential line and the sub differential line is set to 1 UI±0.5×Trf. The transmission time Td4 may be set to (integral multiple of UI)±0.5×Trf. The transmission time Td1 from the impedance mismatching point 904a to the VIA 905a is set to (integral multiple of UI)±0.5×Trf. The transmission time Td2 from the VIA 905a to the connector 907 is set to (integral multiple of UI)±0.5×Trf. The transmission time Td3 from the connector 907 to the impedance mismatching point 904b is set to (integral multiple of UI)±0.5×Trf. The transmission time Td5 from the impedance mismatching point 904b to the pad 902a on a path including the sub differential line and the package internal differential line is set to 1 UI±0.5×Trf. The transmission time Td5 may be set to (integral multiple of UI)±0.5×Trf. The signal waveform is observed based on a differential voltage of the pad 902a.

Also in the case of the printed circuit board shown in FIG. 8, an excellent signal waveform can be maintained similarly as in Embodiment 5.

According to the present invention, noises generated by impedance mismatching points such as a via hole and a connector on the differential line are set so as to be generated within the rise and fall times of the signal waveform having a large margin with respect to a mask pattern. Therefore, a bit error of a circuit can be prevented.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2005-297408, filed Oct. 12, 2005, and 2006-272766, filed Oct. 4, 2006, which are hereby incorporated by reference herein in their entirety.

What is claimed is:

1. A printed circuit board comprising:
   a printed wiring board;
   a first semiconductor device and a second semiconductor device which are mounted on the printed wiring board; and
   a differential line configured to transmit a differential transmission signal between the first semiconductor device and the second semiconductor device, the differential line including at least three mismatching points which are provided therein and separated from one another to provide a line length between each set of adjacent mismatching points,
   wherein the line lengths are configured such that a transmission time for the differential transmission signal to travel between each set of adjacent mismatching points satisfies the following expression:

$$Td = k\text{UI} \pm 0.5 \times Trf$$

where Td is the transmission time, UI is a signal period, Trf is rise and fall times of the differential transmission signal, and k is a positive integer.

2. A printed circuit board according to claim 1, wherein two of the at least three mismatching points are a connection point between the first semiconductor device and the differential line and a connection point between the second semiconductor device and the differential line.

3. A printed circuit board according to claim 1, wherein at least one of the mismatching points is a via hole.

4. A printed circuit board according to claim 1, wherein at least one of the mismatching points comprises a connector.

5. A printed circuit board according to claim 1, wherein the differential line comprises: an internal differential line provided in the first semiconductor device, a sub differential line connected with the first semiconductor device, and a main differential line located on the printed wiring board, and wherein at least one of the mismatching points is a connection point between the internal differential line and a semiconductor element.

6. A printed circuit board comprising:
   a printed wiring board;
   a first semiconductor device and a second semiconductor device which are mounted on the printed wiring board; and
   a differential line configured to transmit a differential transmission signal between the first semiconductor device and the second semiconductor device, the differential line including at least three mismatching points which are provided therein and separated from one another,
   wherein a line length between adjacent mismatching points is configured such that a transmission time satisfies a relationship expressed by the following expression:

$$Tdall = n\text{UI} \pm 0.5 \times Trf$$

where Tdall is the transmission time for the differential transmission signal to travel between two adjacent mismatching points located farthest from each other on the differential line, UI is a signal period, Trf is rise and fall times of a differential transmission signal, and n is a positive integer.

* * * * *